United States Patent
Hatano et al.

(10) Patent No.: US 9,245,711 B2
(45) Date of Patent: Jan. 26, 2016

(54) CHARGED PARTICLE BEAM APPARATUS AND IMAGE FORMING METHOD

(71) Applicant: Hitachi High-Technologies Corporation, Minato-ku, Tokyo (JP)

(72) Inventors: Michio Hatano, Tokyo (JP); Yusuke Abe, Tokyo (JP); Zhigang Wang, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/613,538

(22) Filed: Feb. 4, 2015

(65) Prior Publication Data
US 2015/0221471 A1 Aug. 6, 2015

(30) Foreign Application Priority Data
Feb. 4, 2014 (JP) ................................ 2014-019133

(51) Int. Cl.
*G01N 15/14* (2006.01)
*H01J 37/28* (2006.01)
*H01J 37/22* (2006.01)

(52) U.S. Cl.
CPC .............. *H01J 37/222* (2013.01); *H01J 37/28* (2013.01); *H01J 2237/2448* (2013.01); *H01J 2237/24495* (2013.01)

(58) Field of Classification Search
CPC ............ G01N 15/0227; G01N 15/147; G01N 23/225; H01J 37/265; H01J 37/28
USPC ....................... 250/306, 307, 492.3
See application file for complete search history.

(56) References Cited

U.S. PATENT DOCUMENTS

| 4,814,868 | A * | 3/1989 | James | H04N 7/183 348/138 |
| 7,091,486 | B1 * | 8/2006 | McCord | B82Y 10/00 250/306 |
| 7,609,311 | B2 * | 10/2009 | Denvir | G11C 19/285 348/294 |
| 7,956,324 | B2 * | 6/2011 | Takahashi | G01N 23/225 250/306 |
| 8,284,156 | B2 * | 10/2012 | Miyamoto | G09G 3/344 345/107 |
| 8,659,465 | B2 * | 2/2014 | Simony | H03M 1/58 341/169 |

FOREIGN PATENT DOCUMENTS

JP 2005-4995 A 1/2005

* cited by examiner

*Primary Examiner* — David A Vanore
(74) *Attorney, Agent, or Firm* — Crowell & Moring LLP

(57) ABSTRACT

In observation of a sample having a structure in its depth direction, a charged particle beam apparatus that can form an SEM image reflecting a sample shape at a desired depth by a single image acquisition while avoiding enlargement of the apparatus is provided. The apparatus has: an irradiation optical system for irradiating and scanning a charged particle beam generated from a charged particle source on the sample; a detection optical system having a detector that detects charged particles generated from the sample by the irradiation of the charged particle beam, and converts them into an electric signal at a predetermined sampling period; and an image processing unit for forming an image based on the electric signal from the detector, in which the image processing unit detects a peak of wave height values for each pixel from the electric signal at each sampling time, and forms the image based on the peak of the detected wave height values.

20 Claims, 15 Drawing Sheets

CHARGED PARTICLE BEAM APPARATUS AND IMAGE FORMING METHOD

CLAIM OF PRIORITY

The present application claims priority from Japanese Patent application serial No. 2014-019133, filed on Feb. 4, 2014, the content of which is hereby incorporated by reference into this application.

FIELD OF THE INVENTION

The present invention relates to a charged particle beam apparatus for detecting charged particles obtained by irradiation of a charged particle beam on a sample, and more specifically, to a charged particle beam apparatus for forming an image signal based on an electric signal of an intensity corresponding to an energy of the charged particles emitted from the sample.

BACKGROUND OF THE INVENTION

As charged particle beam apparatuses each of which scans a charged particle beam acting as a probe on a sample surface and obtains an image of the area, there are a scanning electron microscope (SEM), a scanning ion microscope (SIM), a focused ion beam (FIB) processing apparatus, etc. In the general charged particle beam apparatus, while the charged particle beam acting as the probe is irradiated on the sample and is scanned in a field of view that is an observation area, electrons generated from the sample are detected. In the case where the detection object is electrons, an image corresponding to the scanned area is made generally by making signal electrons collide with a detector to convert them into an electric signal, measuring this electric signal in a predetermined time (a sampling time) by an analog to digital (A/D) converter to convert it to a digital signal, and plotting a summation result to a pixel corresponding to a scanning position of the charged particle beam. Incidentally, a sampling time interval is less than or equal to a time interval during which the charged particle beam scans one pixel. This is to prevent a meaningless pixel that may exist even when there is no sampling from existing.

As such a charged particle beam apparatus, there is a case where using the scanning electron microscope, top surface observation of the sample and observation of its internal structure are performed. As one that acquires both of information about a shape of a top surface in the sample and information about a shape inside the sample, an apparatus described in Patent Document 1 is known.

Patent Document 1 discloses a technique that detects the signal electrons by means of energy band pass filtering, assigns a color corresponding to the energy, and displays an image with brightness corresponding to a detected intensity using an energy selective detector of electric field shielding type that mounts an energy filter based on electric field shielding and an energy selective detector of orbital selection type utilizing a fact that the signal electrons take different trajectories depending on their energies. According to the energy filter of orbital selection type, detection of the signal electrons by the energy band pass filtering can be performed by a single image acquisition according to the number of arranged detectors, and performing image processing off-line makes it possible to output an SEM image only of a top surface that reflects information of only low-energy-loss back scattered electrons (BSE) and to output the SEM images of the top surface and of the inside of the sample that reflect BSE information of all the energy bands that are detected.

CITATION LIST

Patent Document

Patent Document 1: Japanese Unexamined Patent Application Publication No. 2005-4995

However, since Patent Document 1 uses a multichannel system that acquires BSE of a wide energy band at once, it is necessary to provide a signal processing circuit for every energy band that is to be selected, which requires enlargement of the apparatus, and further calibration or tuning to a plurality of signal processing circuits.

The present invention provides a charged particle beam apparatus that can form an SEM image reflecting a sample shape at a desired depth by a single image acquisition while avoiding the enlargement of the apparatus in observation of a sample having a structure in its depth direction.

SUMMARY OF THE INVENTION

In order to solve the above-mentioned problems, the present invention is characterized by configuring a charged particle beam apparatus to have: an irradiation optical system for irradiating and scanning a charged particle beam emitted from a charged particle source on a sample; a detection optical system having a detector that detects the charged particles generated from the sample by the irradiation of the charged particle beam and converts them into an electric signal at a predetermined sampling period; and an image processing unit for forming an image based on the electric signal from the detector, so that the image processing unit may count the number of charged particles detected for each pixel from an electric signal pulse at each sampling time and form an image based on wave height values of the electric signal pulse.

According to the present invention, in observation of the sample having the structure in the depth direction, it becomes possible to provide a charged particle beam apparatus that can form the SEM image reflecting the sample shape at the desired depth by a single image acquisition while avoiding the enlargement of the apparatus.

Problems, configurations, and effects other than what were described above will be clarified by explanations of the following embodiments.

DETAILED DESCRIPTION OF THE PREFERRED EMBODIMENTS

Figure 1:
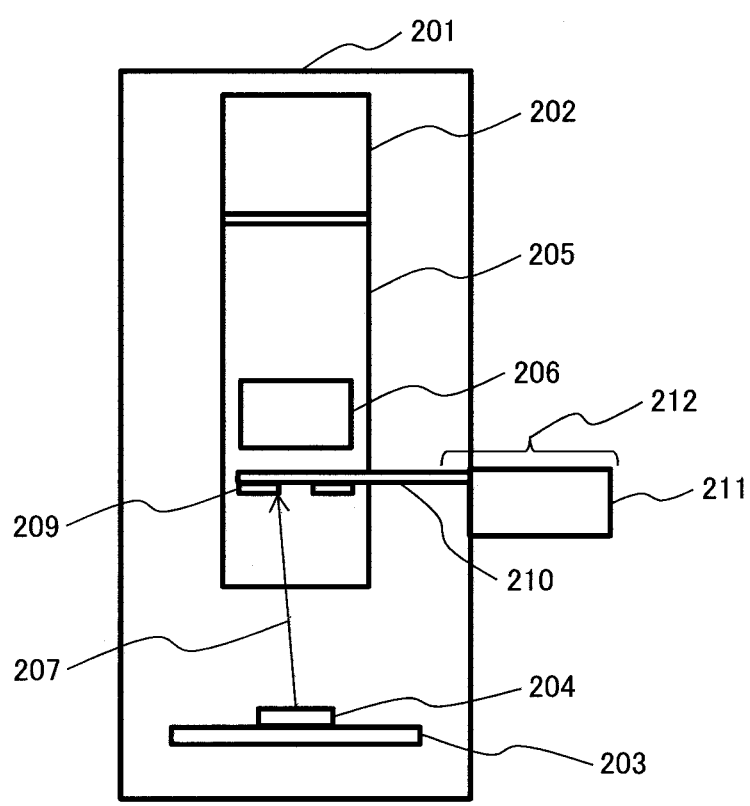
FIG. 1 is an overall configuration diagram of a charged particle beam apparatus according to a first embodiment of the present invention.

In the following, taking the scanning electron microscope as an example for the charged particle beam apparatus, there will be described the scanning electron microscope that acquires information of a sample surface through detection of signal electrons (BSE) generated from the sample by irradiating the probe electrons on the sample to be observed and scanning them on the sample, especially, one that forms a one or a plurality of multiple SEM images reflecting a sample shape (internal shape) at a desired depth from the sample surface at a single image acquisition.

In embodiments of the present invention, as a precondition, it is necessary to determine detection of the signal electrons from an output electric signal of the detector at each sampling time that is a minimum time unit of signal detection. For this reason, it is desirable that the number of the BSE that can be detected during one sampling time may be unity at maximum. Even when two pieces of BSE enter into the detector at one sampling time, the number of rises of the electric signal is unity. In that case, a wave height of the electric signal that is acquired becomes a value depending on a sum of energies of the two pieces of BSE, and each energy cannot be correctly measured with discrimination. In order to reduce the number of the BSE detected at one sampling time to unity or less, what is necessary is to set an amperage of a probe electron beam and a scan speed of the probe electron beam appropriately from the interval of the sampling time that is governed by an A/D converter.

Although a scanning time per pixel is decided by the scan speed of the probe electron beam set by an observer and the number of total pixels of the image, in some cases, there is a possibility that the sampling time comes only several times (for example, two times) in a time interval of the scanning for one pixel. In such a case, since the largest number of theoretically detectable signal electrons becomes equal to the number of times of sampling in each pixel by a technique explained below (in the example, two at maximum), a maximum luminance per pixel is small (luminance 2 at maximum), and a high signal-to-noise ratio (SN) is not expectable in one frame image obtained by one time of scanning. In such a case, during a time when a single image acquisition is performed, the image with the high SN is obtained by performing multiple times of scanning in an area of the field of view and integrating the images of frames that correspond to the number of time of scanning. In this embodiment, a detector whose output electric signal has the wave height depending on a detected energy of BSE is needed. As examples of such a detector, there are some detectors including: a detector that combines an optical amplifier and a scintillator that makes the signal electrons collide with a fluorescent material, converts them into light, and amplifies the optical signal with an optical amplifier represented by a photomultiplier tube to convert it into an electric signal; a semiconductor detector that makes the signal electrons collide with a detector including a semiconductor such as silicon and germanium to make electron-and-hole pairs inside the semiconductor, and converts them into an electric signal by collecting them to an electrode; an avalanche detector that amplifies electrons generated by incidence of signal electrons in an individual semiconductor in an avalanche manner by means of a potential slope applied in the inside and converts them into an electric signal by collecting them to an electrode; etc. Incidentally, the detector is not limited to what were described above, and may be whatever detector other than the above as long as the output electric signal that is detected is dependent on the energy of BSE.

Moreover, the charged particle beam apparatus is not limited to the scanning electron microscope and may be a scanning ion microscope or a focused ion beam processing apparatus.

Hereinafter, embodiments will be described using drawings.

First Embodiment

FIG. 1 is an overall configuration diagram of a charged particle beam apparatus according to a first embodiment of the present invention. FIG. 1 shows a schematic configuration of the scanning electron microscope (SEM). The SEM according to this embodiment has a column 201 whose interior is maintained in vacuum, and includes, inside the column 201, an electron beam source 202, a sample holder 203, a sample 204 held by the sample holder 203, an electron beam optical system 205 for focusing an unillustrated probe electron beam generated by the electron beam source 202 into a desired diameter on the sample 204, an electron beam deflector 206 for scanning the probe electron beam in an area of the desired field of view on the sample 204, and an annular shaped fluorescent material 209 for converting signal electrons 207 generated from the sample into an optical signal. Here, in the electron beam optical system 205, there are arranged an unillustrated extraction electrode, an accelerating electrode for accelerating the probe electrons from an electron beam source 202 to a desired energy with the extraction electrode, an objective lens that makes it possible for the probe electron beam to be irradiated on the surface of the sample 204 with a desired probe diameter, etc. The annular shaped fluorescent material 209 has a central hole (aperture) for allowing the probe electron to pass through, and the signal electrons 207 such as BSE that are generated from the sample by the probe electrons being irradiated on the sample through the central hole collide with the annular shaped fluorescent material 209, which causes the optical signal to be generated. The optical signal is transmitted to a signal processing system by the light guide 210, and the signal processing system converts the optical signal into an electric signal, performs A/D conversion of it, carries out wave height measurement processing depending on an output intensity of the electric signal, and convert it into a signal for image. A signal electron detection system 212 is constructed with the annular shaped fluorescent material 209, the light guide 210, and the signal processing system 211.

Figure 2:
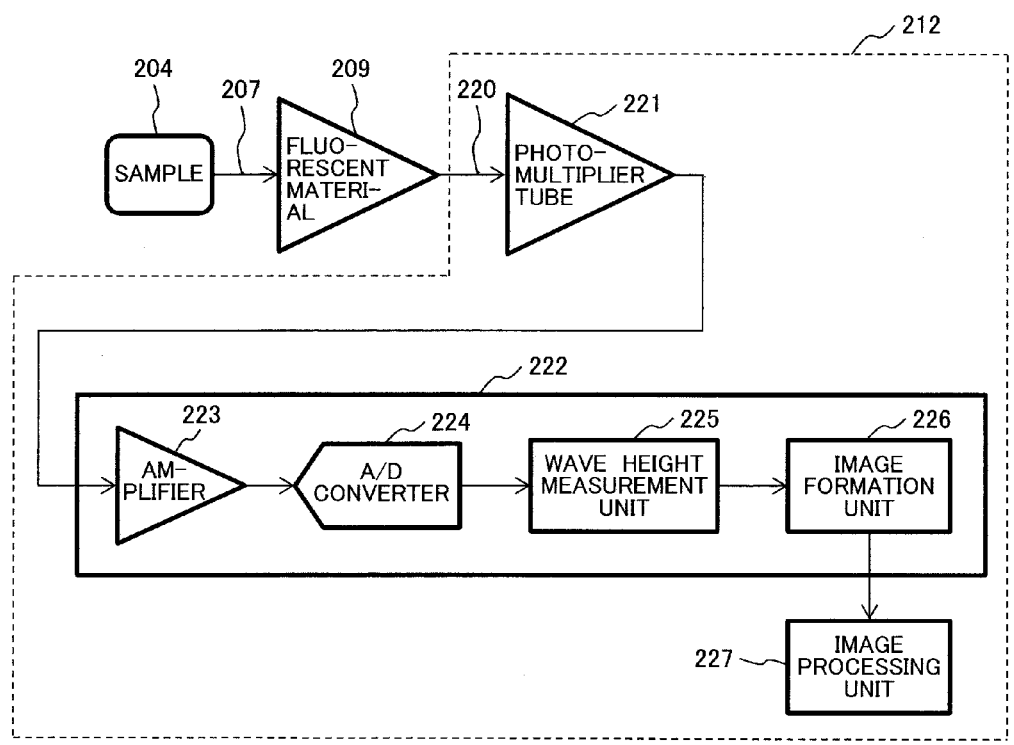
FIG. 2 is a functional block diagram of a signal electron detection system shown in FIG. 1.

FIG. 2 is a functional block diagram of the signal electron detection system 212 shown in FIG. 1. The signal electrons generated from the sample 204 collide with the annular shaped fluorescent material 209, and generate an optical signal 220. A photomultiplier tube 221 coverts this optical signal 220 into an electric signal, amplifies it, outputs it to a signal detection circuit 222. The signal detection circuit 222 has an amplifier 223, an analog to digital converter (A/D converter) 224, a wave height measurement unit 225, and an image formation unit 226. The amplifier 223 amplifies the electric signal output from the photomultiplier tube 221, and outputs it to the A/D converter 224. The A/D converter 224 samples an electric signal output of the amplifier 223 at a predetermined clock, converts it into a digital voltage signal, and outputs the signal to the wave height measurement unit 225. The wave height measurement unit 225 determines whether the signal electrons are detected or not from the digital voltage signal at each sampling time. When detection determination is made, it measures the wave height of the digital voltage signal and outputs the determination result and the wave height to the image formation unit 226 in its post stage. The image formation unit 226 performs filter processing according to the wave height, and outputs a single or multiple pieces of one frame image information to an image processing unit 227 in its post stage. The image processing unit 227 collects pieces of image data for the number of scanning times that is a number of times previously specified, performs image processing such as averaging processing and gradation processing, and outputs a final digital image.

Figure 3:
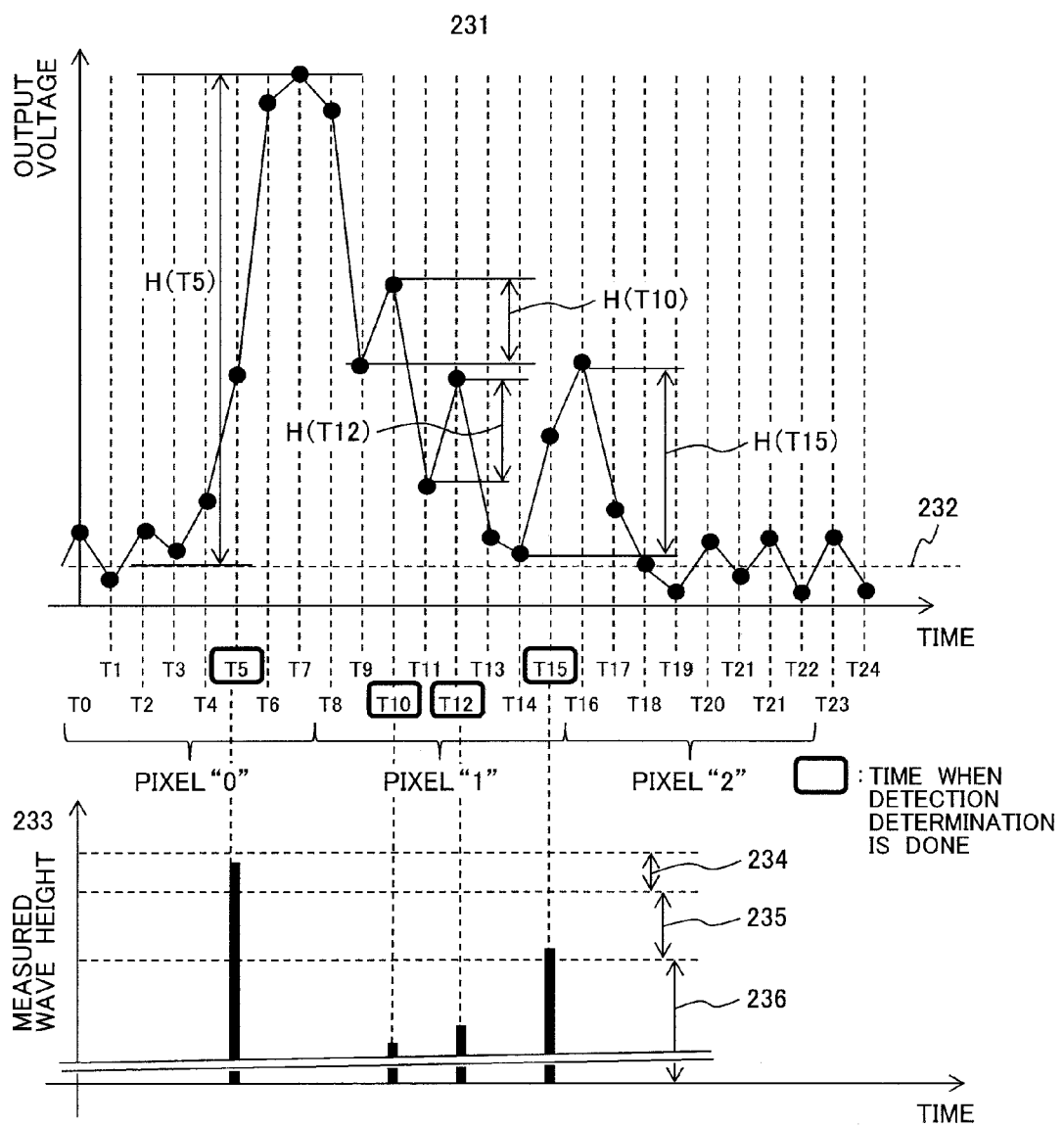
FIG. 3 is an explanatory diagram of a relationship between an output voltage waveform from an A/D converter shown in FIG. 2 and a measured wave height by a wave height measurement unit.

FIG. 3 is an explanatory diagram of a relationship between the output voltage waveform from the A/D converter shown in FIG. 2 and the measured wave height by the wave height measurement unit. This is a diagram for explaining processing of the image formation unit 226. The upper section of FIG. 3 is a graph in which the output voltage of the digital voltage signal outputted by the A/D converter 224 with respect to the sampling time is plotted. T0 is a first sampling time that contributes to imaging of one line of one frame. A baseline 232 is a mean value of the output voltage when the probe electrons are not irradiated on the sample. Here, it is assumed that sampling is performed eight times during a time in which the probe electrons scan over a distance for one pixel on the sample 204. That is, a pixel "0" of the image that is finally obtained corresponds to a position on the sample 204 that the probe electrons scan at times of T0 to T7; a pixel "1" thereof corresponds to a position on the sample 204 that the probe electrons scan at times of T8 to T15; and a pixel "2" thereof corresponds to a position on the sample 204 that the probe electrons scan at times of T16 to T22. Now, assume that a determination that the signal electrons are detected by the wave height measurement unit 225 at T5, T10, T12, and T15 during sampling times T1 to T24 is made. Incidentally, it should be noted that this embodiment does not specify an algorithm of the detection determination and may use any algorithm. The wave height measurement unit 225 measures the followings as wave height values, respectively, using a later-described wave height measurement algorithm: for the detection determination at T5, a wave height H(T5) spanning from the base line to the output voltage at a sampling time T7; and for the detection determination at T10, the wave height H(T10) spanning from the output voltage at a sampling time T9 to the output voltage at a sampling time T10. Moreover, the wave height measurement unit 225 measures the followings as the wave height values, respectively: for the detection determination at T12, a wave height H(T12) that spans from the output voltage at a sampling time T11 to the output voltage at a sampling time T12; and for the detection determination at T15, a wave height H(T15) that spans from the output voltage at a sampling time T14 to the output voltage at a sampling time T16, and outputs the sampling times at which the detection determinations are outputted and the measured wave height values to the image formation part in the post stage. The image formation unit 226 applies the filter processing on the measured wave height values with a previously set technique according to the measured wave height. Incidentally, measurement of the wave height value will be described later using FIG. 15.

Figure 4:
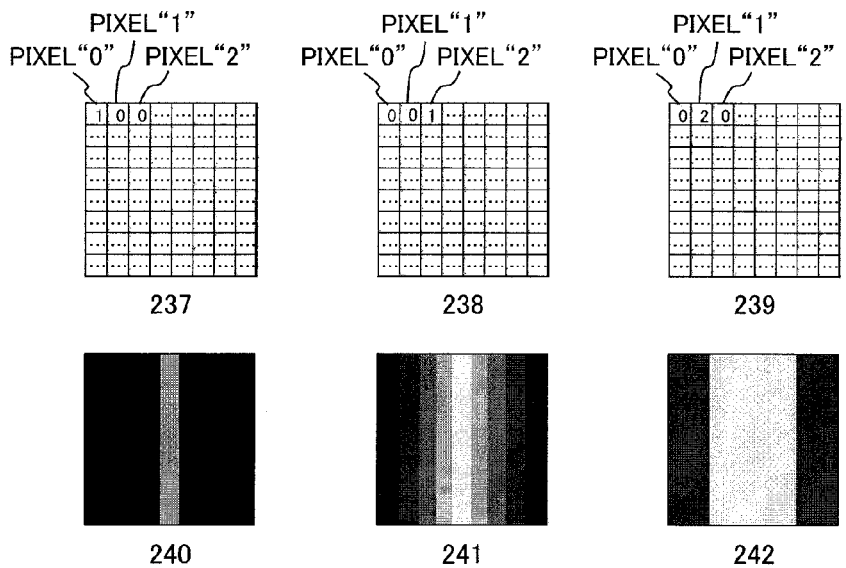
FIG. 4 is an SEM image obtained by the charged particle beam apparatus shown in FIG. 1.

In the following, one example of the filter processing of the image formation unit 226 will be explained using a graph of the measured wave height in the lower section of FIG. 3. The image formation unit 226 discriminates and processes the wave height values in three areas of a high wave-height area 234, a medium wave-height area 235, and a low wave-height area 236. The wave height value discriminated in the high wave-height area 234 is unity in the pixel "0", the wave height value discriminated in the medium wave-height area 235 is unity in the pixel "2", and the wave height values discriminated in the low wave-height area 236 are two in the pixel "1". The image formation unit 226 prepares data for one frame image in the high wave-height area, data for one frame image in the medium wave-height area, and data for one frame image in the low wave-height area, and adds unity to the luminance of a corresponding pixel of each image according to the wave height. When having scanned the field of view, three images, i.e., a one frame image 237 in the high wave-height area, a one frame image 238 in the medium wave-height area, and a one frame image in the low wave-height area as shown in the upper section of FIG. 4 are obtained. Here, it is assumed that a scanning direction of the probe electrons is a direction from the left to the right of the sheet of the drawing. Upon completion of scanning over a distance equivalent to one line, the probe electron moves by a fixed quantity in the vertical direction on the sheet and makes scanning from the left to the right direction starting from that place. Where the whole field of view has been scanned, the scanning of one frame is completed. Incidentally, the scanning direction of the SEM in this embodiment is not limited to the above-mentioned raster scan method, and may be any one of the scanning directions as long as it can scan the whole area of the field of view corresponding to the pixels of the output image.

Each time the field of view is scanned once, the image formation unit 226 delivers three images to the image processing unit 227. The image processing unit 227 collects pieces of image data for the number of scanning times (the number of frames) that is a number of times previously specified, performs the image processing such as the averaging processing, the gradation processing, etc., and outputs the final digital image. A high wave-height area image 240, a medium wave-height area image 241, and a low wave-height area image 242 all of which are modeled after frame integration are shown in the lower section of FIG. 4.

Figure 5:
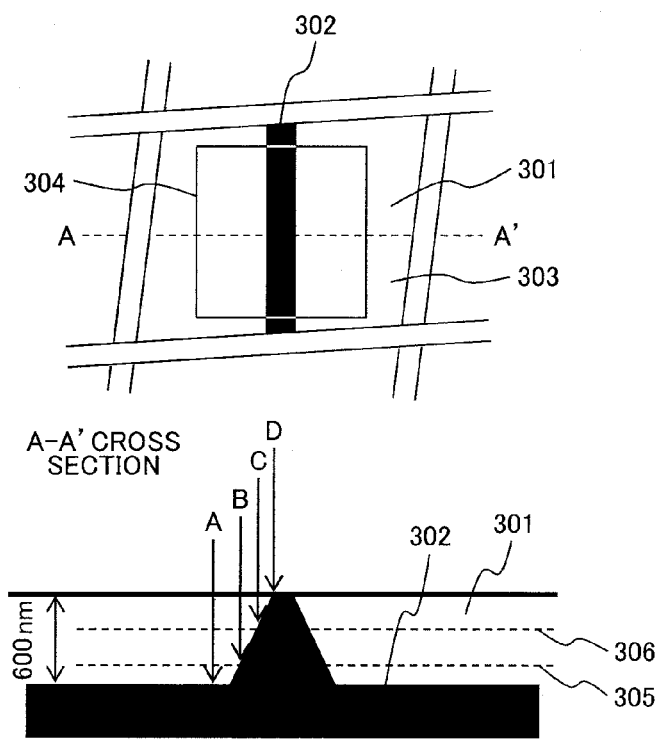
FIG. 5 is a top view and a sectional view of a sample having a structure in its depth direction.

In the following, an explanation of meaning that the above-mentioned discrimination image has will be given. FIG. 5 is a top view and a sectional view of the sample having a structure in its depth direction. An image in the lower section of FIG. 4 is an image when a field of view 304 of a sample 303 shown in the upper section of FIG. 5 is observed by probe electrons of an energy of 20 keV. The sample 303 is configured of a structure 301 whose composition is silicon and a structure 302 whose composition is molybdenum. The lower section of FIG. 5 is an A-A' sectional view in a top view.

Figure 7:
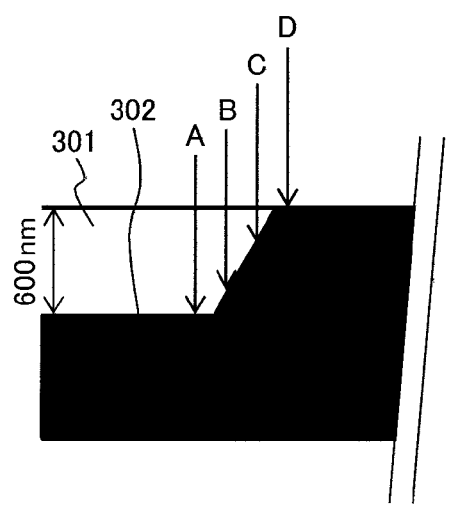
FIG. 7 is a sectional view of the sample having the structure in the depth direction.
Figure 8:
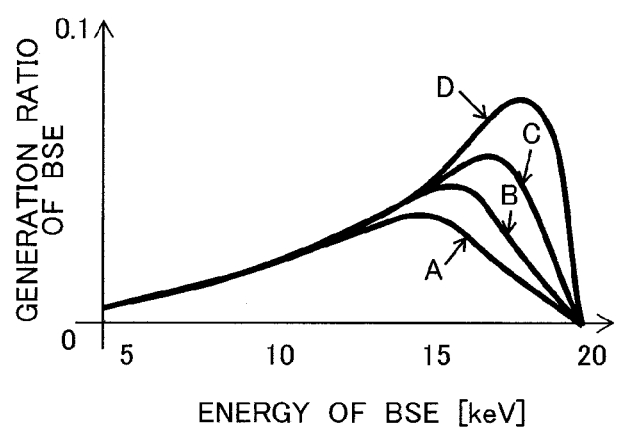
FIG. 8 is a relationship diagram of an energy of BSE acquired from the sample shown in FIG. 7 and the generation ratio of BSE.

Here, a relationship between a position in the depth direction of the internal shape of the sample, the energy of BSE, and a generation ratio of BSE will be explained using FIG. 7 and FIG. 8. FIG. 7 is a sectional view of a sample having a structure in the depth direction, and the structure 302 whose composition is molybdenum has a taper shape that is slanted from the sample surface toward the depth direction as deep as nm. Assume cases where the probe electrons of 20 keV are irradiated at a position D in the top surface of the sample, a position A on the bottom 600-nm deep, and positions B, C located at different positions on the inclined plane that goes from the D to the A. An amount of generation of BSE is decided depending on an attenuation rate 1 that depends on an energy being lost when the probe electrons pass through the structure of silicon, the generation ratio of BSE of the molybdenum structure 302, and an attenuation rate 2 that depends on an energy being lost when the probe electrons pass through the structure 301 of silicon and reaches the sample surface after being reflected by the molybdenum structure 302. In addition, the larger the distance between the structure 302 of molybdenum and the sample surface, namely, the depth, the larger the above-mentioned attenuation rate 1 and attenuation rate 2 become. Therefore, as shown in FIG. 8, the larger the distance from the sample surface, the smaller the generation ratio of BSE becomes, and as a position goes from the position D on the top surface of the sample toward the position A having a larger depth, the generation ratio of BSE becomes smaller.

Figure 6:
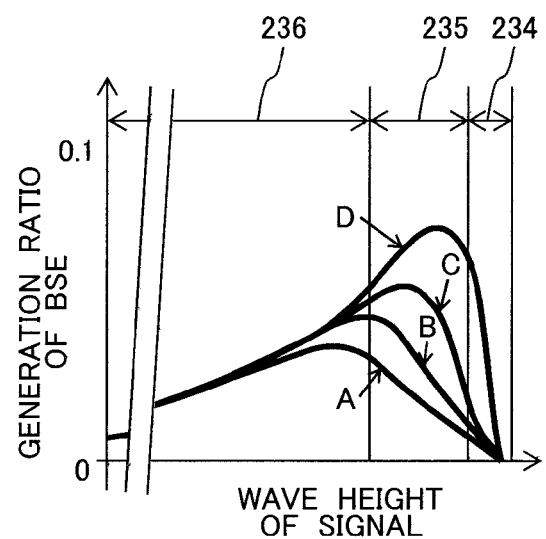
FIG. 6 is a relationship diagram of a signal wave height acquired from the sample shown in FIG. 5 and a generation ratio of BSE with probe electrons set to 20 keV.
Figure 9:
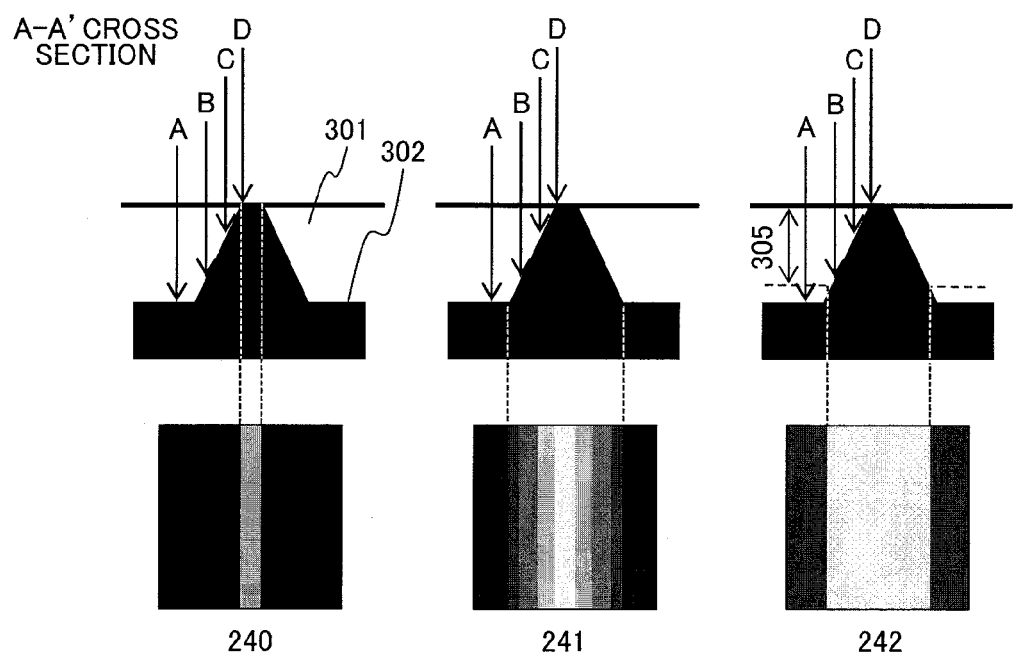
FIG. 9 is a diagram showing a relationship between a cross section structure of the sample and a corresponding SEM image.

FIG. 6 shows a relationship between the generation ratio of BSE when the probe electrons are set to 20 keV and the probe electron beam is irradiated on the positions A to D of the sample shown in FIG. 5 and the wave height of the detected BSE signal. Assuming that there is no variation in emission of the annular shaped fluorescent material 209 and that the wave height of the signal is proportional to the energy of BSE strictly, a relationship between the wave height and the amount of generation of BSE will become the same shape as a graph shown in FIG. 8. The high wave-height area 234, the medium wave-height area 235, and the low wave-height area 236 that are areas used for wave height discrimination correspond to respective areas shown in the graph of FIG. 8. At this time, the obtained images become like the high wave-height area image 240, the medium wave-height area image 241, and the low wave-height area image 242 shown in the lower section of FIG. 4. It should be noted that each image has information at a different depth in the depth direction, respectively. A difference among pieces of depth information included in respective images will be explained using FIG. 6 and FIG. 9. As shown in FIG. 6, the high wave-height area image has a large contrast between the position D and positions other than this, but has little contrast between the position A and the position C in the high wave-height area 234. For this reason, as shown in the left-hand side of FIG. 9, the SEM image becomes one that reflects information of the top surface. As shown in FIG. 6, the medium wave-height area image 241 has contrasts among all the positions A to D in the medium wave-height area 235. For this reason, as shown in the center of FIG. 9, the image becomes an SEM image with a gradation of brightness depending on the depth of the molybdenum structure 302. As shown in FIG. 6, the low wave-height area image 242 has little contrast between the position B and the position D, but has a contrast between the position B and the position A in the low wave-height area 236. For this reason, the SEM image becomes to an image like a sectional view at a depth 305, as shown in the right-hand side of FIG. 9.

Figure 10:
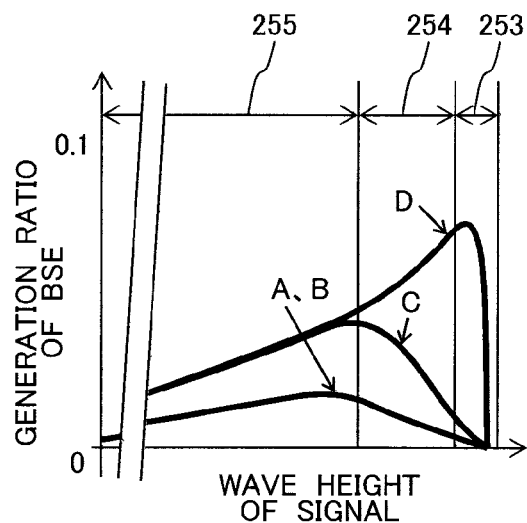
FIG. 10 is a relationship diagram of the signal wave height acquired from the sample shown in FIG. 5 and the generation ratio of BSE with the probe electrons set to 10 keV.
Figure 11:
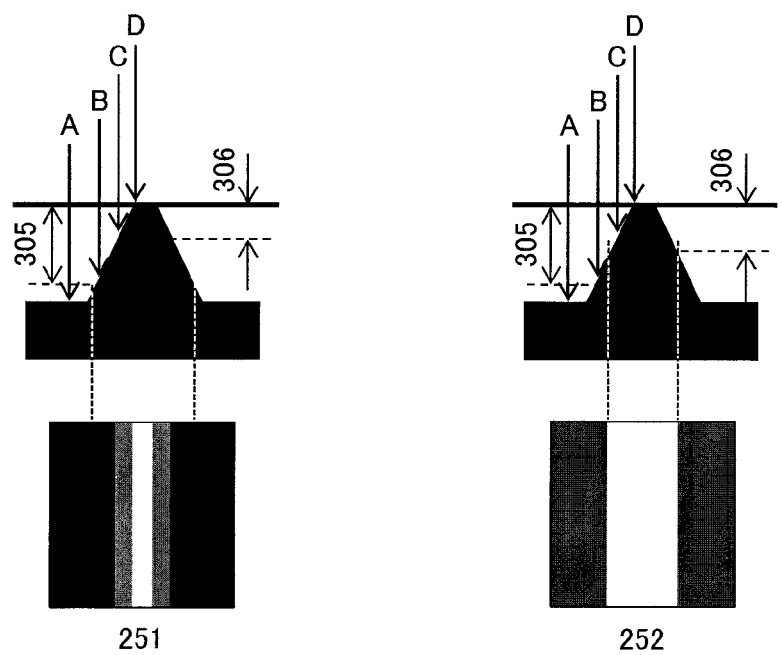
FIG. 11 is a diagram showing a relationship between a cross section structure of the sample and a corresponding SEM image.

Here, when observing a shallower area, what is necessary is to decrease the energy of the probe electrons. FIG. 10 shows a relationship between the signal wave height acquired from the sample shown in FIG. 5 and the generation ratio of BSE with the probe electrons set to 10 keV. That is, the figure shows a graph of a relationship between the generation ratio of BSE when the probe electron beam is irradiated on the points A to D and the wave height of the detected BSE signal with the energy of the probe electrons set to 10 keV. At this time, although the SEM image obtained using the high wave-height area 253 becomes an image that is almost not different from the high wave-height area image 240, the SEM image obtained using the medium wave-height area 254 has no contrast between the position A and the position B, but has contrasts among the positions B, C, and D, becoming a medium wave-height area image 251 shown in FIG. 11. The low wave-height area image 252 obtained in the low wave-height area 255 has no contrast between the position A and the position B, and also has no contrast between the position C and the position D. On the other hand, since there is a contrast between the position C(D) and the position B(A), the low wave-height area image 252 becomes an image like a section pattern at a depth 306.

As described above, it becomes possible to obtain three kinds of SEM images: the SEM image that reflects the information on the top surface by a single image acquisition while maintaining resolution that the apparatus has; the SEM image that reflects a structure in the depth direction as a gradation; and the SEM image as shown like a sectional view at an arbitrary depth.

Although it is assumed in the above that the wave height of the signal is strictly proportional to the energy of BSE, there is a case where the proportionality does not hold actually. In such a case, the following scheme may be adopted: a relationship between the energy of BSE and the wave height is investigated in advance, and the image processing unit 227 performs gradation correction based on the information so that the brightness may be proportional to the energy of BSE. Alternatively, the following scheme may be adopted: a relationship between the energy of BSE and the depth is obtained from simulation, etc., and the image processing unit 227 performs the gradation correction on the image based on the information so that the brightness may be proportional to the depth.

In the above, although the case where the wave height was discriminated in three areas not overlapping one another and three images were outputted was explained, the areas that are discriminated may be more than three and the areas may overlap one another. Moreover, as shown below, multiple obtained images may be processed to synthesize a single image.

Figure 12:
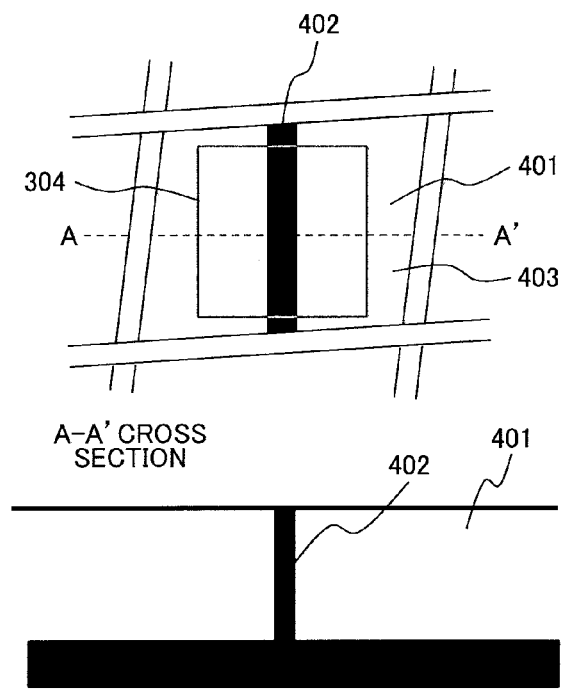
FIG. 12 is a top view and a sectional view of a sample having a uniform structure in the depth direction.
Figure 13:
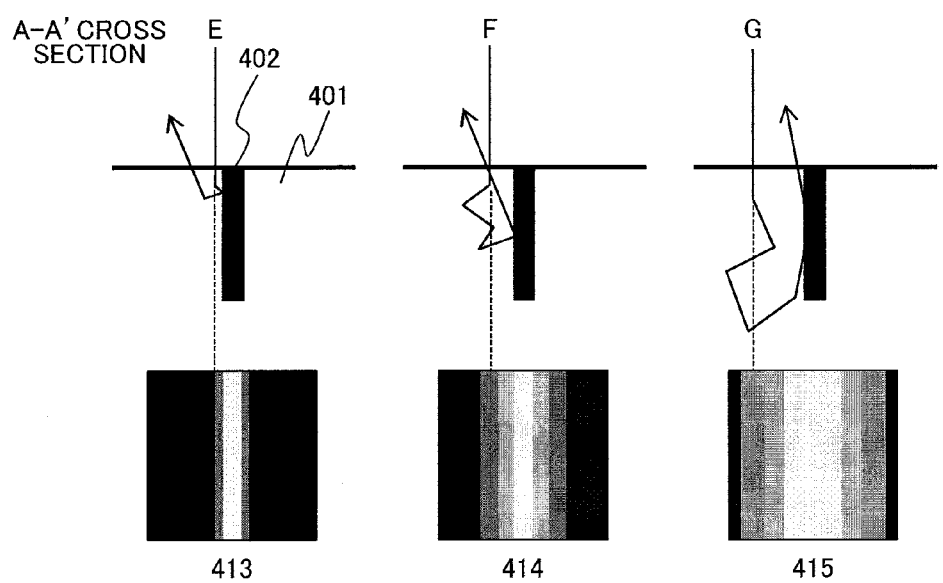
FIG. 13 is a diagram showing a relationship between an irradiation position of the probe electrons to the sample shown in FIG. 12 and a corresponding SEM image.

In the following, one example in which a technique of synthesizing one image by processing obtained a plurality of images is effective will be shown. FIG. 12 is a top view and a sectional view of the sample having a uniform structure in the depth direction. This is the sample 403 configured of a structure 401 whose composition is silicon and a structure 402 whose composition is molybdenum. The upper section of FIG. 12 is a top view (observation face) and the lower section is the A-A' sectional view. The sample 403 has a uniform structure such that its shape does not depend on the depth direction. Consider that when the energy of the probe electrons is 20 keV, the same wave height discrimination as the above-mentioned is performed to acquire three images. FIG. 13 is a diagram that shows images obtained at this time and behaviors of the BSE for explaining the images. A low wave-height area image 415 shown in the right is equivalent with what is obtained by selecting the BSE of the low energy and imaging it to an image. Among the BSE like this, there are many BSE each of whose energy loss inside the sample is large and movement distance in the sample is long. In this case, since a probability of hitting the molybdenum structure 402 becomes high even in the case of the probe electrons that are irradiated on a point G relatively far from the molybdenum material 402, there is a case where the probe electrons cause the BSE to occur. As a result, the low wave-height area image 415 becomes an image with a gradation fatter than the width of the original molybdenum structure 402. Similarly, a medium wave-height area image 414 shown in the center and a high wave-height area image 413 become images each with a fat gradation according to the energy band to be selected.

Figure 14:
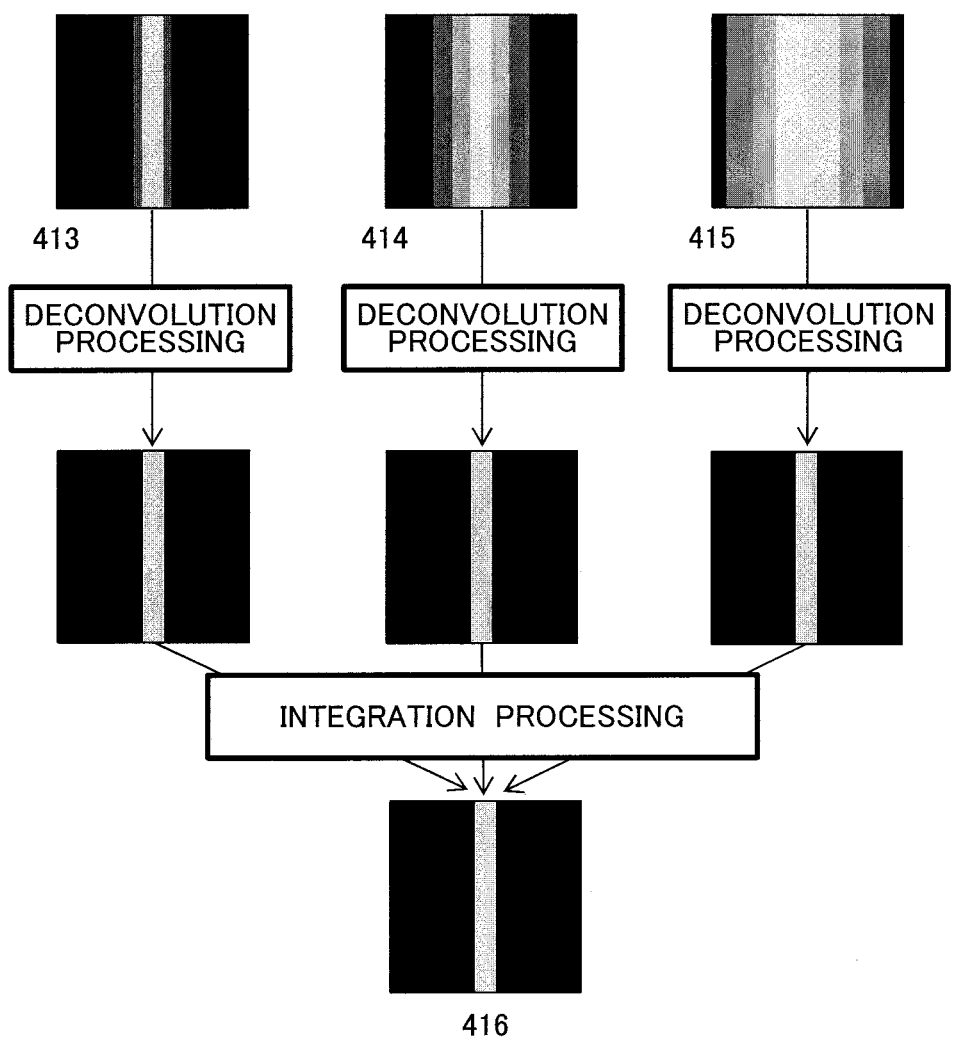
FIG. 14 is an explanatory diagram of synthesis of a plurality of SEM images.

In such a case, as shown in FIG. 14, a multi-deconvolution image 416 with few gradation regions each being close to an actual sample shape can be obtained by integrating all the images after performing deconvolution processing (reverse superimposition processing) with a parameter according to each gradation width for every wave-height area image. Although the parameter of the deconvolution that is decided for each wave-height area image may be found by analyzing the obtained images 413, 414, and 415, in that case, the parameter that should be uniquely decided by a composition of the sample and the energy of the probe electrons originally will be influenced by the SN of the image that depends on the amperage of the probe electrons, the number of integrated frames, etc. A more effective method is a technique of predicting the behavior of the BSE in the sample by Monte Carlo simulation, etc. and deciding an optimal parameter in the case where the composition of the sample is known. Such a simulator may be built in a computer for controlling the SEM, in which the simulator may be configured to do as follows: to input therein the sample shape in advance; to automatically calculate, for example, a Gaussian of the probe electrons as the deconvolution parameter in a stage where an acceleration voltage of the probe electrons and the wave height areas to be discriminated are set; and to output the multi-deconvolution image 416 that is subjected to the deconvolution processing.

The technique of processing the obtained a plurality of images to synthesize them into a single image is not limited to the multi deconvolution processing that was shown in the above. The techniques may be synthesis processing such as a technique of highlighting information of a certain depth, for example, by highlighting a single or multiple wave-height area images and synthesizing all the wave-height area images, and synthesis processing such as a technique of highlighting a variation of brightness of specific depth information by performing differentiation processing of a single or multiple wave-height area images and synthesizing all the wave-height area images.

Figure 15:
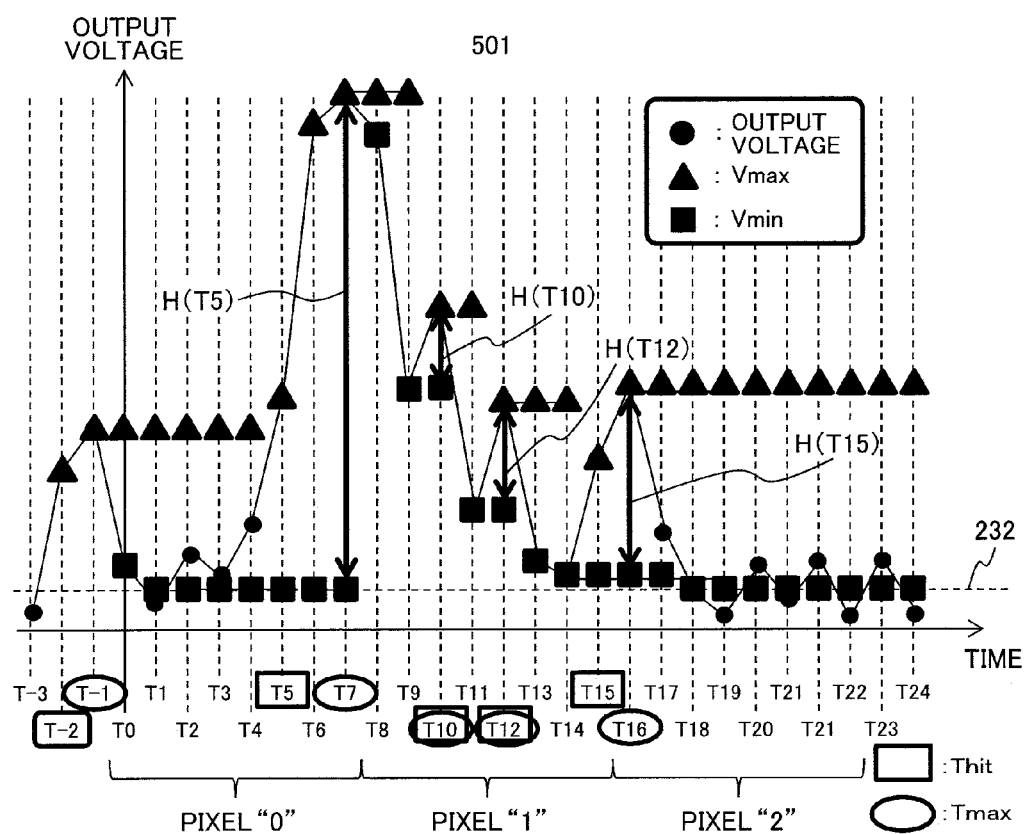
FIG. 15 is an explanatory diagram of wave height measurement processing by the wave height measurement unit shown in FIG. 2.

Next, the wave height measurement processing by the wave height measurement unit 225 will be explained. FIG. 15 is an explanatory diagram of the wave height measurement processing by the wave height measurement unit 225 shown in FIG. 2. Here, regarding the wave height measurement processing in the case of forming the image data for one frame, processing for three pixels will be explained as an example. Paying attention to an output voltage V(T) obtained at every sampling time T, the measurement is started at a point in time when the output voltage V(T) exceeds the baseline 232 (Vbase) and the following steps are done: (1) A maximum value Vmax and a minimum value Vmin of the output voltage are set from a value of the last time and a variation of a present value of the output voltage, and are stored; (2) When the present value of the output voltage exceeds the stored Vmax, the Vmax is updated to the output voltage V(T) at the sampling time T, or when the present value falls below the Vmin, the Vmin is updated to the output voltage V(T) at the sampling time T; and (3) When only either one of the Vmax and the Vmin is updated from non-updating states of the both Vmax and Vmin and subsequently the both are switched to the non-updating states, a value of the other is reset. The processing is performed so that these conditions may be fulfilled.

This processing will be explained concretely. FIG. 15 shows a graph 501 in which a behavior of the output voltage at sampling times (T−3, T−2, and T−1) earlier than T0 is additionally written to the graph 231 shown in the upper section of FIG. 3. Generally, scanning of the probe electrons starts before acquisition of the data for imaging, and this algorithm uses the output voltage value at that time. When it is detected that V(T−2) exceeds a voltage value Vbase of the baseline 232 at the sampling time T−2, the image formation unit 226 memorizes a value of Thit=T in an unillustrated storage apparatus in order to memorize a detection determination time. Updating of the maximum value Vmax used for wave height measurement is started from this sampling time T−2, and processing of Vmax=V(T) is performed. In subsequent sampling times, whenever Vmax<V(T) holds, the processing of Vmax=V(T) (the updating of the maximum value Vmax) is performed each time. In FIG. 15, the Vmax at an initial time is Vmax=V(T−2), and since the output voltage V(T−1) at the next sampling time T−1 exceeds the V(T−2) that is a value of the previous time, the Vmax is updated to V(T−1). At the next sampling time T0, the detected output voltage V(T0) has a relation of V(T0)<V(T−1), and the Vmax becomes to satisfy Vmax ≥V(T). In order to memorize a time when the maximum value of the output voltage was obtained, a value of Tmax=T−1 is memorized and the updating is ended with the Vmax remained as V(T−1). Updating of the minimum value Vmin used for the wave height measurement is started from this time and processing of Vmin=V(T) is performed. At subsequent sampling times, whenever Vmin>V(T) holds, processing of Vmin=V(T), namely, update processing of the Vmin is performed each time. When the Vmin is updated, the Vmin and the voltage value Vbase of the baseline 232 are compared, and if Vmin<Vbase holds, processing of Vmin=Vbase will be performed (in FIG. 15, a time when this occurs for the first time is a sampling time T1). During sampling times T2 to T4, since V(T)≥Vmin and Vmax≥V(T) hold, the Vmax remains as the V(T−1) that was stored at the sampling time T−1 and the Vmin remains as the Vbase that was stored at the sampling time T1 without being updated. The Vmax and the Vmin will be in the non-updating states.

At the sampling time T5, the output voltage V (T5) becomes V(T5)>Vmax=V(T−1), and the stored Vmax is updated from V(T−1) to V(T5). After this, the stored Vmax is updated to V(T6) and then V(T7) sequentially because a state of V(T)>Vmax continues up to the sampling time T7.

At a sampling time T8, Vmax=V(T7)>V(T8) holds and updating of the Vmax stops. By this update stop, the value of the Vbase stored as the Vmin up to this time is reset, and the V(T8) is stored as a new Vmin (this corresponds to the above-mentioned condition (3)). At a point in time of the sampling time T9, the Vmin is updated to V(T9), at a point in time of the sampling time T10, V(T10)>Vmin=V(T9) comes to hold, and updating of the Vmin stops. By this update stop of the Vmin, the V(T7) that has been stored as the Vmax is reset, and the V(T10) is newly stored as the Vmax (this corresponds to the above-mentioned condition (3)). Thus, the updating of the Vmin is started by the update stop of the Vmax after the start of the updating of the Vmax; and the Vmax having been stored until that time is reset by the update stop of the Vmin after the start of the updating of the Vmin and the updating of the Vmax is started. This makes it possible to measure the wave height values in each pixel.

As shown in FIG. 15, values of the Vmax and the Vmin corresponding to decided each sampling time are shown by a solid triangle and a solid square, respectively. A wave height H(Thit) corresponding to the Thit is decided by an absolute value of a difference of the Vmax and the Vmin, H(Thit) =|Vmax−Vmin|, at Tmax that is nearest after Thit. The wave height H(T5)=|V(T7)−Vbase| at the sampling time T7 and a wave height H(T10)=|V(T10)−V(T9)| at the sampling time T10 are obtained, and wave heights H(T12) and H(T15) are obtained similarly. The wave height measurement unit 225 outputs the wave height value and a sampling time at which the wave height value is measured to the image formation unit 226.

Incidentally, in this embodiment, although the output voltage at each sampling time is compared with the value of the last time and is also compared with the Vmax and the Vmin that are to be stored, what should be done is not limited to this. For example, instead of making determination of Vmax≥V(T) at the time of decision of the Tmax, Vmax−V(T)≥C that uses a positive constant C as a threshold may be used as a criterion. Incidentally, what is necessary to set the threshold C is just to perform the sampling before executing image formation processing of an observation area, check an influence of noises, and set it. By doing thus, even in the case where a noise is added to the obtained signal, i.e., the output voltage V(T) despite being in the middle of rise of the signal actually, determination accuracy can be maintained.

Moreover, in this embodiment, as shown in FIG. 15, although the output voltages V(T) for three pixels from the pixel "0" to the pixel "2" were acquired and the Thit was decided, and subsequently the wave height values in each pixel were measured, the method is not limited to this, and may be such that the wave height value is measured at a point in time when only either one of the Vmax and the Vmin is updated without deciding the Thit. For example, in FIG. 15, the wave height value at the sampling time T7 may also be measured at the timing when the output voltage V(T8) at the sampling time T8 is acquired.

As described above, according to this embodiment, in observation of the sample having the structure in the depth direction, it becomes possible to form an SEM image that reflects the sample shape at the desired depth by a single image acquisition while avoiding enlargement of the apparatus.

Second Embodiment

Figure 16:
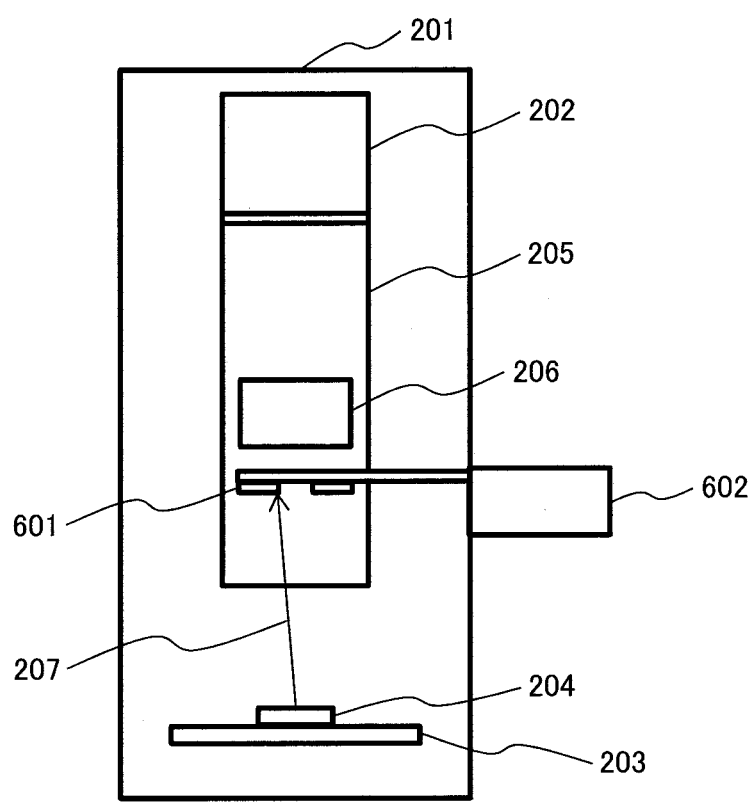
FIG. 16 is an overall configuration diagram of a charged particle beam apparatus according to a second embodiment of the present invention.
Figure 17:
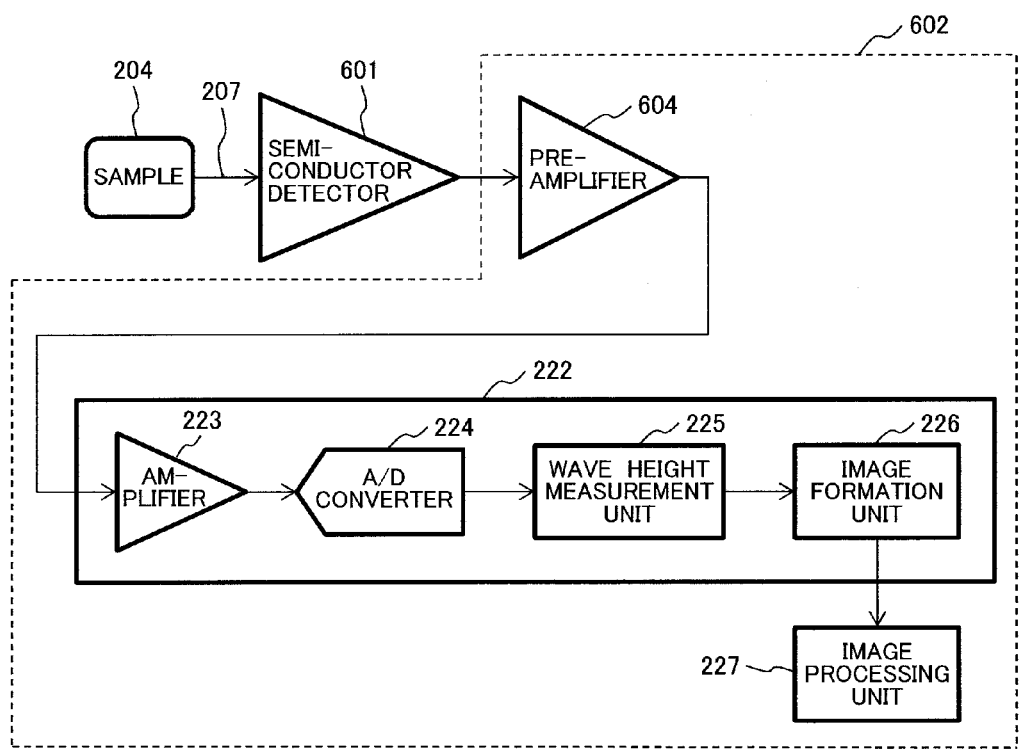
FIG. 17 is a functional block diagram of the signal electron detection system shown in FIG. 16.

FIG. 16 is an overall configuration diagram of a charged particle beam apparatus according to a second embodiment of the present invention. The same reference numeral is given to the same component as that of FIG. 1. A different point from the first embodiment is a point that the detector is not made of a fluorescent material but an annular shaped semiconductor detector 601 is used. FIG. 17 shows a functional block diagram of a signal processing system 602 of this embodiment. As shown in FIG. 17, in this embodiment, the semiconductor detector 601 is provided in place of the fluorescent material 209 of which the signal processing system 212 of the first embodiment shown in FIG. 2 is configured, and a preamplifier 604 is provided in place of the photomultiplier tube 221. Other configurations such as that of the wave height measurement processing are the same as those of the first embodiment.

According to this embodiment, it becomes possible to form the SEM image that reflects the sample shape at the desired depth by a single image acquisition in the observation of the sample having the structure in the depth direction while avoiding the enlargement of the apparatus similarly with the first embodiment.

Moreover, in this embodiment, as compared with a detector configured of a combination of the fluorescent material and the photomultiplier tube of the first embodiment, it becomes possible to perform the wave height discrimination in more detail because the semiconductor detector 601 whose energy resolution is high is used.

Third Embodiment

Figure 18:
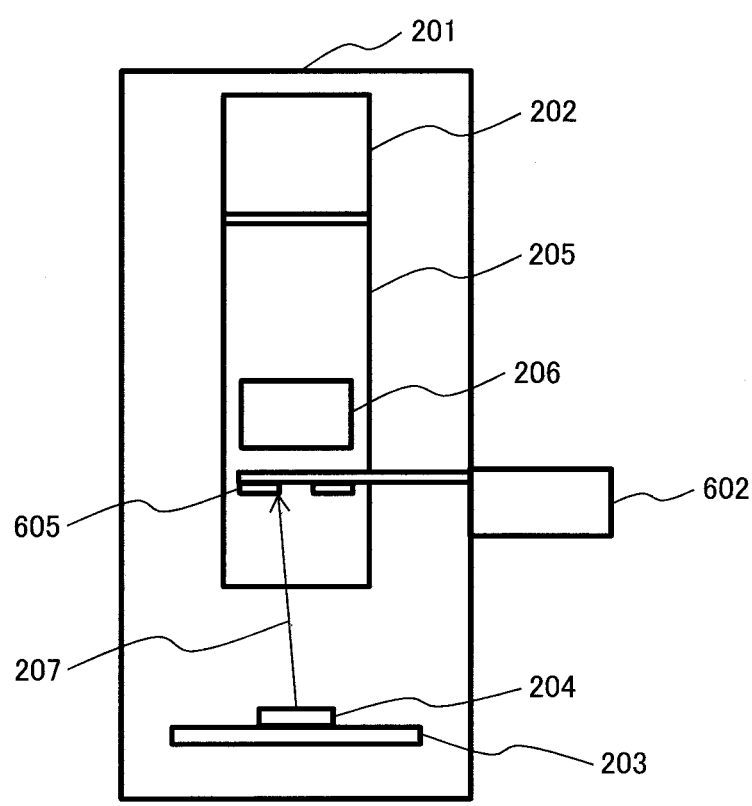
FIG. 18 is an overall configuration diagram of a charged particle beam apparatus according to a third embodiment of the present invention.

FIG. 18 is an overall configuration diagram of a charged particle beam apparatus according to a third embodiment of the present invention. The same reference numeral is given to the same component as that of FIG. 16. This embodiment is different from the second embodiment in a point that an annular shaped avalanche detector 605 is used in place of the semiconductor detector 601 in the second embodiment. Other configurations such as that for the wave height measurement processing are the same as those of the first embodiment.

According to this embodiment, it becomes possible to form an SEM image that reflects the sample shape at the desired depth by a single image acquisition in the observation of the sample having the structure in the depth direction while avoiding the enlargement of the apparatus similarly with the first embodiment.

Moreover, the avalanche detector 605 has features that has comparatively high energy resolution and is higher in gain than the semiconductor detector 601. For this reason, as compared with the second embodiment, it becomes possible to perform detailed wave height discrimination with high detection accuracy.

Fourth Embodiment

Figure 19:
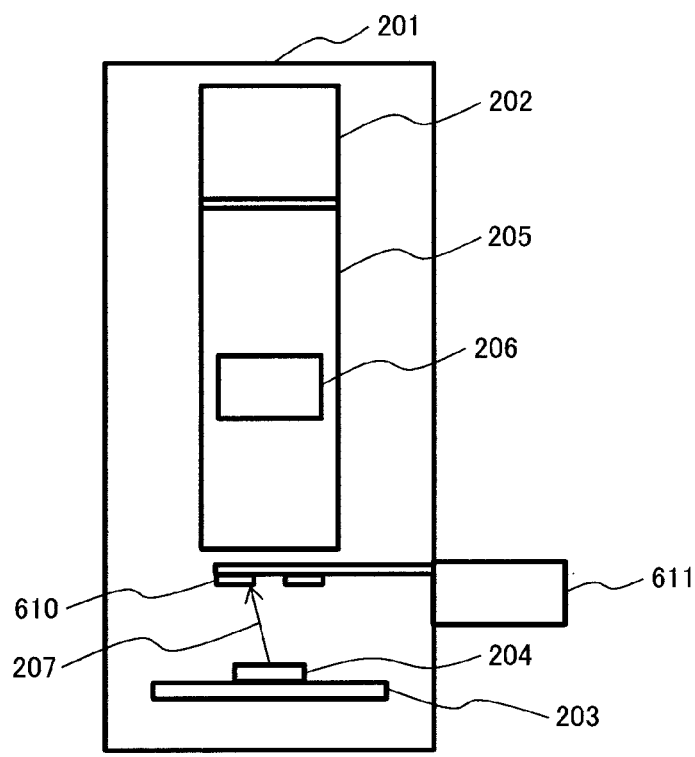
FIG. 19 is an overall configuration diagram of a charged particle beam apparatus according to a fourth embodiment of the present invention.

FIG. 19 is an overall configuration diagram of a charged particle beam apparatus according to a fourth embodiment of the present invention. The same reference numeral is given to the same component as that of FIG. 1, FIG. 16 and FIG. 18. The fourth embodiment is different from the first to third embodiments in a point that an annular shaped detector 610 arranged not inside the electron optical system 205 but between the electron optical system 205 and the sample 204. For the annular shaped detector 610, any one of the detectors of the first to third embodiments may be used, and a signal processing system 611 takes a configuration that corresponds to the selected detector. Other configurations such as that for the wave height measurement processing are the same as those of the first embodiment.

According to this embodiment, it becomes possible to form an SEM image that reflects the sample shape at the desired depth by a single image acquisition while avoiding the enlargement of the apparatus in the observation of the sample having the structure in the depth direction, similarly with the first embodiment.

Moreover, in this embodiment, it becomes possible to detect the BSE with a wide acceptance as compared with the first to third embodiments, and to obtain the SEM image with the high SN using a relatively small number of integrated frames.

Fifth Embodiment

Figure 20:
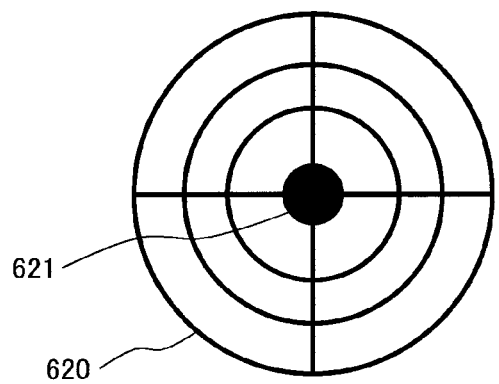
FIG. 20 is a block diagram of a detector according to a fifth embodiment of the present invention.

FIG. 20 shows an annular shaped multichannel detector 620. The annular shaped multichannel detector 620 has a central hole 621 through which the probe electron beam passes, and its sensitive surface facing the sample is segmented as shown in the figure. The number of the signal processing system of this embodiment is the same as the number of segmented portions. The detector may be any one of the detectors of the first to third embodiments. Moreover, the detectors may be arranged inside the electron optical system similarly with the first to third embodiments, or may be arranged between the electron optical system and the sample similarly with the fourth embodiment.

According to this embodiment, it is possible to obtain a selected image that depends on an elevation angle and an azimuth angle of the emitted BSE, and to obtain a pulse height discriminated image that considers a three-dimensional shape of the sample.

Sixth Embodiment

Figure 21:
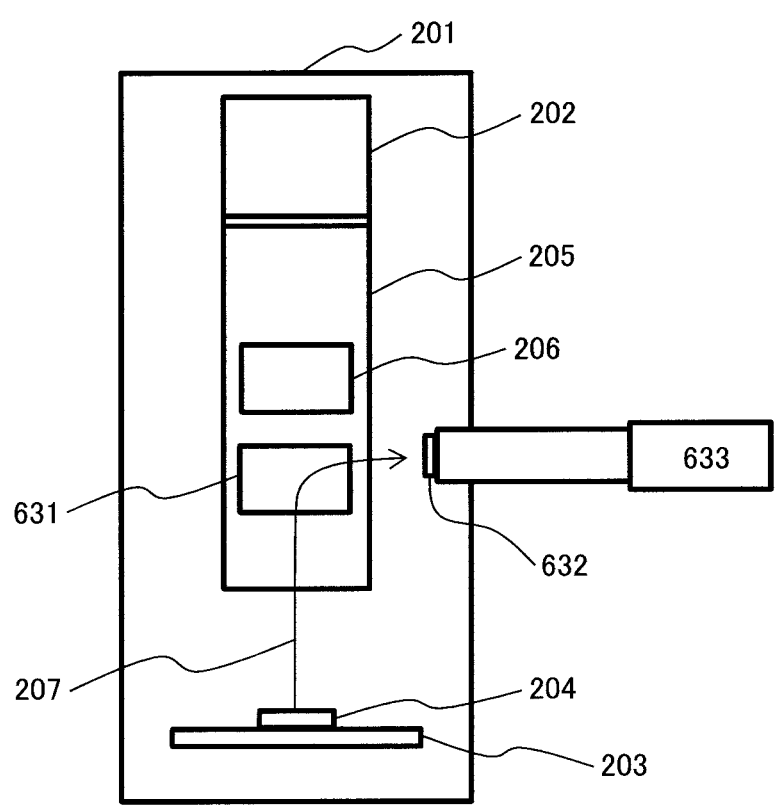
FIG. 21 is an overall configuration diagram of a charged particle beam apparatus according to a sixth embodiment of the present invention.

FIG. 21 shows an overall configuration diagram of a charged particle beam apparatus according to a sixth embodiment of the present invention. The same reference numeral is given to the same component as that of FIG. 1. This embodiment has a Wien filter 631 for deflecting the BSE out of the optical axis inside the electron optical system 205. A detector 632 is arranged off axis. The detector 632 may be any one of the detectors of the first to third embodiments described above. However, its shape is not annular shaped, but is generally rectangular.

According to this embodiment, it becomes possible to form the SEM image reflecting the sample shape at the desired depth by a single image acquisition.

Moreover, in this embodiment, it is possible to detect the BSE that takes a trajectory passing through the central hole of the detector and failed to be grasped by the annular shaped detectors of the first to fifth embodiments and, as a result, to improve the SN.

Incidentally, the present invention is not limited to the above-mentioned embodiments, and includes various modifications. For example, the above-mentioned embodiments were explained in detail in order to comprehensively explain the present invention, and the embodiments are not necessarily limited to one that includes all the constituents having been explained. Moreover, a part of a configuration of a certain embodiment can be replaced with a configuration of another embodiment and a configuration of another embodiment can be added to the configuration of the certain embodiment. Moreover, it is possible to perform addition, deletion, and substitution of a constituent of another embodiment regarding a part of the configuration of the each embodiment.

REFERENCE SIGNS LIST

201 . . . column
202 . . . electron beam source
203 . . . sample holder
204 . . . sample
205 . . . electron beam optical system
206 . . . electron beam deflector
207 . . . signal electron
209 . . . annular shaped fluorescent material
211 . . . signal processing system
212 . . . signal electron detection system
220 . . . optical signal
221 . . . photomultiplier tube
222 . . . signal detection circuit
223 . . . amplifier
224 . . . A/D converter
225 . . . wave height measurement unit
226 . . . image formation unit
227 . . . image processing unit
232 . . . baseline
234,253 . . . high wave-height area
235,254 . . . medium wave-height area
236,255 . . . low wave-height area
237 . . . one frame image in the high wave-height area
238 . . . one frame image in the medium wave-height area
239 . . . one frame image in the low wave-height area
240,413 . . . high wave-height area image
241,251,414 . . . medium wave-height area image
242,252,415 . . . low wave-height area image
301,401 . . . structure whose composition is silicon
302,402 . . . structure whose composition is molybdenum
303,403 . . . sample
304 . . . field of view
305,306 . . . sectional view at a depth
416 . . . multi-deconvolution image
601 . . . semiconductor detector
602 . . . signal processing system
605 . . . avalanche detector
610 . . . detector
611 . . . signal processing system
620 . . . multichannel detector
621 . . . central hole
631 . . . Wien filter
632 . . . detector

What is claimed is:

1. A charged particle beam apparatus, comprising:
   an irradiation optical system for irradiating and scanning a charged particle beam emitted from a charged particle source on a sample;
   a detection optical system having a detector that detects charged particles generated from the sample by irradiation of the charged particle beam and converts the detected charged particles into an electric signal at a predetermined sampling period; and
   an image processing unit for forming an image based on the electric signal from the detector,
   wherein the image processing unit counts the number of the charged particles detected for each pixel from an electric signal pulse at each sampling time, and forms an image based on wave height values of the electric signal pulse.

2. The charged particle beam apparatus according to claim 1,
wherein the image processing unit compares the electric signal pulse obtained at the each sampling time with the electric signal pulse at the latest sampling time, and detects a peak of the wave height values for the each pixel based on a wave height value at a point in time when updating of only either one of a maximum value and a minimum value of the wave height values stops.

3. The charged particle beam apparatus according to claim 2,
wherein the wave height values that were subjected to the peak detection for each pixel are discriminated into a plurality of wave height areas and a luminance of the pixel is set based on a count value for each wave height area after the discrimination.

4. The charged particle beam apparatus according to claim 3,
wherein the image processing unit performs peak detection of the wave height values for each of pixels for one line of which the image data is configured.

5. The charged particle beam apparatus according to claim 3,
wherein the detector is an annular shaped detector, and is arranged on an optical axis of the irradiation optical system.

6. The charged particle beam apparatus according to claim 5,
wherein the annular shaped detector has an opening that enables the charged particle beam to pass through in a center of the detector and a sensitive surface of the detector facing the sample is divided into a plurality of segments.

7. The charged particle beam apparatus according to claim 3,
further comprising a deflector for deflecting the charged particles generated from the sample by the irradiation of the charged particle beam out of an optical axis of the irradiation optical system,
wherein the detector is arranged on a trajectory of the charged particles that are deflected by the deflector.

8. The charged particle beam apparatus according to claim 2,
wherein the wave height values that were subjected to the peak detection for each pixel are discriminated into a plurality of wave height areas, image data configured of a plurality of pixels is generated for each wave height area after the discrimination, and pieces of image data for the each wave height area are synthesized.

9. The charged particle beam apparatus according to claim 8,
wherein deconvolution processing is performed on the image data formed for the each wave height area, and pieces of the image data after the processing are synthesized.

10. The charged particle beam apparatus according to claim 8,
wherein the image processing unit performs peak detection of the wave height values for each of pixels for one line of which the image data is configured.

11. The charged particle beam apparatus according to claim 8,
wherein the detector is an annular shaped detector, and is arranged on an optical axis of the irradiation optical system.

12. The charged particle beam apparatus according to claim 8,
further comprising a deflector for deflecting the charged particles generated from the sample by the irradiation of the charged particle beam out of an optical axis of the irradiation optical system,
wherein the detector is arranged on a trajectory of the charged particles that are deflected by the deflector.

13. The charged particle beam apparatus according to claim 2,
wherein the wave height values that were subjected to the peak detection for each pixel are discriminated into a plurality of wave height areas, and
wherein image data is formed based on only the wave height values included in a predetermined wave height area.

14. The charged particle beam apparatus according to claim 13,
wherein the image processing unit performs peak detection of the wave height values for each of pixels for one line of which the image data is configured.

15. The charged particle beam apparatus according to claim 13,
wherein the detector is an annular shaped detector, and is arranged on an optical axis of the irradiation optical system.

16. The charged particle beam apparatus according to claim 13,
further comprising a deflector for deflecting the charged particles generated from the sample by the irradiation of the charged particle beam out of an optical axis of the irradiation optical system,
wherein the detector is arranged on a trajectory of the charged particles that are deflected by the deflector.

17. The charged particle beam apparatus according to claim 2,
wherein the image processing unit performs peak detection of the wave height values for each of pixels for one line of which image data is configured.

18. An image forming method of a charged particle beam apparatus that irradiates a charged particle beam on a sample, detects charged particles generated from the sample, and forms an image, comprising the steps of:
a step for converting the detected charged particles into an electric signal at a predetermined sampling period;
a step for counting the number of the detected charged particles for each pixel from an electric signal pulse at each sampling time; and
a step for forming an image based on wave height values of the electric signal pulse.

19. The image forming method of a charged particle beam apparatus according to claim 18, further comprising the steps of:
a step for comparing the electric signal pulse obtained at the each sampling time with the electric signal pulse obtained at the latest sampling time;
a step for updating a maximum value or a minimum value of the wave height values according to a comparison result; and a step for detecting a peak of the wave height values for the each pixel based on the wave height value at a point in time when updating of either only one of the maximum value or the minimum value of the wave height values stops.

20. The image forming method of a charged particle beam apparatus according to claim 19, further comprising the steps of:
   a step for discriminating the wave height values that were subjected to the peak detection for each pixel into a plurality of wave height areas previously set; and
   a step for setting a luminance of the pixel based on a count value for each wave height area that was subjected to the discrimination.

* * * * *